United States Patent
Hong et al.

(10) Patent No.: US 7,968,405 B2
(45) Date of Patent: Jun. 28, 2011

(54) NONVOLATILE MEMORY DEVICES AND METHODS OF MANUFACTURING THE SAME

(75) Inventors: Eun-Mi Hong, Yongin-si (KR); Kwang-Tae Kim, Suwon-si (KR); Ji-Hoon Park, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 577 days.

(21) Appl. No.: 12/026,812

(22) Filed: Feb. 6, 2008

(65) Prior Publication Data

US 2008/0197401 A1    Aug. 21, 2008

(30) Foreign Application Priority Data

Feb. 15, 2007 (KR) .................. 10-2007-0016080

(51) Int. Cl.
*H01L 21/336* (2006.01)

(52) U.S. Cl. . 438/257; 438/267; 257/315; 257/E21.683; 257/E29.129

(58) Field of Classification Search .......... 438/257–267; 257/315, 317, 321, E29.129, E21.683
See application file for complete search history.

(56) References Cited

U.S. PATENT DOCUMENTS

| | | | |
|---|---|---|---|
| 6,323,085 B1 * | 11/2001 | Sandhu et al. | 438/257 |
| 6,373,095 B1 * | 4/2002 | Bracchitta et al. | 257/316 |
| 6,391,722 B1 | 5/2002 | Koh | |
| 6,555,427 B1 * | 4/2003 | Shimizu et al. | 438/238 |
| 6,677,224 B2 | 1/2004 | Tseng | |

FOREIGN PATENT DOCUMENTS

| | | |
|---|---|---|
| KR | 1019990072300 | 9/1999 |
| KR | 20050002422 | 1/2005 |
| KR | 1020070000216 | 1/2007 |

OTHER PUBLICATIONS

English Abstract for Publication No. 1019990072300.
English Abstract for Publication No. 1020070000216.

* cited by examiner

*Primary Examiner* — David Vu
(74) *Attorney, Agent, or Firm* — F. Chau & Associates, LLC

(57) ABSTRACT

A method of manufacturing a nonvolatile memory device is provided. The method includes forming an isolation layer in a semiconductor substrate defining an active region and forming a molding pattern on the isolation layer. A first conductive layer is formed on a sidewall and a top surface of the molding pattern and on the semiconductor substrate. The first conductive layer on the top surface of the molding pattern is selectively removed forming a conductive pattern. The conductive pattern includes a body plate disposed on the active region and a protrusion which extends from an edge of the body plate onto the sidewall of the molding pattern. The molding pattern is then removed. An inter-gate dielectric layer is formed on the isolation layer and the conductive pattern. Nonvolatile memory devices manufactured using the method are also provided.

15 Claims, 14 Drawing Sheets

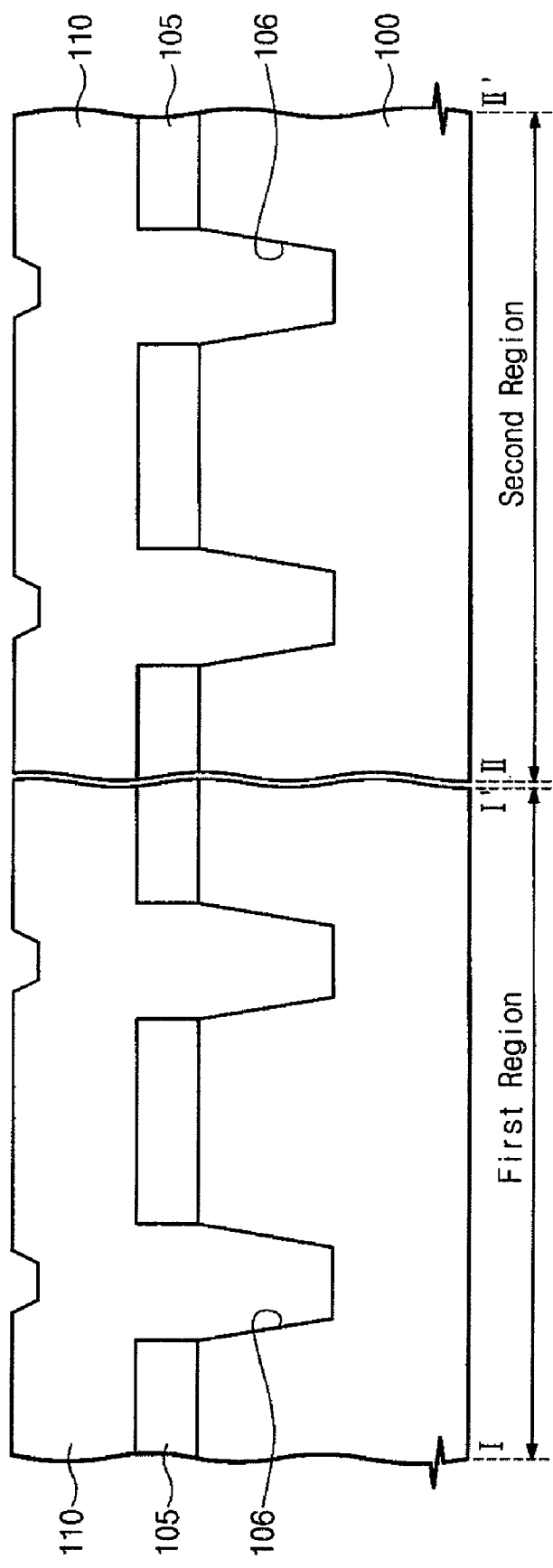

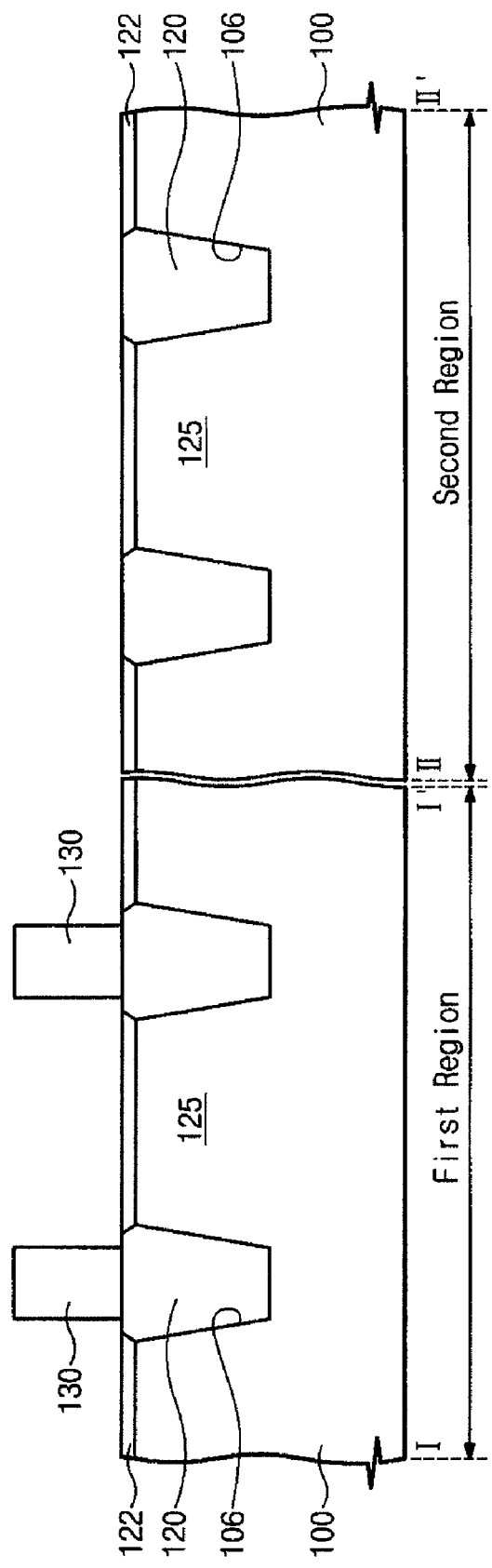

NONVOLATILE MEMORY DEVICES AND METHODS OF MANUFACTURING THE SAME

CROSS-REFERENCE TO RELATED APPLICATION

This application claims priority under 35 U.S.C §119 to Korean Patent Application No. 10-2007-0016080, filed on Feb. 15, 2007, the contents of which is hereby incorporated by reference in its entirety.

BACKGROUND OF THE INVENTION

1. Technical Field

The present invention relates to memory devices and, more particularly, to nonvolatile memory devices and methods of manufacturing the same.

2. Discussion of the Related Art

Nonvolatile memory devices retain their stored data even when their power supplies are turned off. Electrically erasable and programmable read only memory (EEPROM) devices are a form of nonvolatile memory devices which may be electrically programmed and erased. The EEPROM devices may comprise a floating gate tunnel oxide (FLOTOX) type EEPROM device, and the FLOTOX type EEPROM device may comprise a plurality of memory cells.

A unit cell of the FLOTOX type EEPROM device may include a memory transistor for storing a single bit data and a selection transistor for controlling an electrical access to the memory transistor. The memory transistor may be laterally spaced apart from the selection transistor on a semiconductor substrate. The memory transistor may include a floating gate which is electrically insulated from other conductive elements adjacent thereto. The memory transistor may further include a tunnel oxide layer disposed between a portion of the floating gate and the semiconductor substrate as well as a memory gate oxide layer which extends from the tunnel oxide layer along a surface of the semiconductor substrate. The tunnel oxide layer may be thinner than the memory gate oxide layer. The memory transistor may further include an inter-gate dielectric layer on the floating gate and a control gate on the inter-gate dielectric layer. The memory gate oxide layer, the tunnel oxide layer, the floating gate, the inter-gate dielectric layer, and the control gate may constitute a stacked gate structure. The memory transistor may also include a source region and a floating junction region formed in the semiconductor substrate. The source region and the floating junction region may be disposed at opposite sides of the stacked gate structure.

When a program voltage or an erasure voltage is applied between the control gate and the floating junction region, a Fowler-Nordheim (F-N) tunneling current may flow through the tunnel oxide layer. As a result, electrons in the semiconductor substrate may be injected into the floating gate, or electrons in the floating gate may be injected into the semiconductor substrate. When the electrons in the semiconductor substrate are injected into the floating gate, the memory transistor may be programmed. When the electrons in the floating gate are injected into the semiconductor substrate, the memory transistor may be erased.

The program voltage or the erasure voltage may be determined according to a coupling ratio of the memory transistor. The coupling ratio may depend upon the ratio of a voltage induced at the floating gate to a voltage applied to the control gate. That is, the coupling ratio may be approximately equal to the ratio of an inter-gate dielectric capacitance between the control gate and the floating gate to a total capacitance of the inter-gate dielectric capacitance and a tunnel oxide capacitance between the floating gate and the semiconductor substrate. Thus, when the coupling ratio is close to "1," the program efficiency and the erasure efficiency may increase to reduce the program voltage and the erasure voltage.

The inter-gate dielectric capacitance may be increased to increase the coupling ratio. An overlap area between the control gate and the floating gate may be increased and/or a thickness of the inter-gate dielectric layer may be reduced to increase program efficiency and erasure efficiency. In particular, as the nonvolatile memory devices including the EEPROM device become more highly integrated, there may be a need to reduce the thickness of the inter-gate dielectric layer to scale down the memory device. However, there may be a limitation in reducing the thickness of the inter-gate dielectric layer. This is because a leakage current flowing through the inter-gate dielectric layer may be increased and may thus cause degradation of the program efficiency and the erasure efficiency when the thickness of the inter-gate dielectric layer is decreased. Accordingly, the area of the inter-gate dielectric layer between the control gate and the floating gate may be increased in order to realize high performance nonvolatile memory devices with a high integration density.

SUMMARY OF THE INVENTION

Exemplary embodiments of the present invention are directed to methods of manufacturing a nonvolatile memory device and nonvolatile memory devices manufactured using the methods. In an exemplary embodiment, one such method includes forming an isolation layer in a semiconductor substrate defining an active region and forming a molding pattern on the isolation layer. A first conductive layer is formed on a sidewall and a top surface of the molding pattern and on the semiconductor substrate. The first conductive layer on the top surface of the molding pattern is selectively removed forming a conductive pattern. The conductive pattern is formed including a body plate disposed on the active region and a protrusion which extends from an edge of the body plate onto the sidewall of the molding pattern. The molding pattern is then removed. An inter-gate dielectric layer is formed on the isolation layer and the conductive pattern.

In some embodiments, the molding pattern may be formed by forming a molding layer on the substrate including the isolation layer and patterning the molding layer exposing the active region.

In some embodiments, the molding pattern may be formed having a width which is less than an upper width of the isolation layer, and the body plate may be formed extending onto an edge of the isolation layer.

In some embodiments, the first conductive layer may comprise a polysilicon layer.

In some embodiments, a vertical thickness of the body plate may be greater than a lateral thickness of the protrusion.

In some embodiments, the conductive pattern may be formed by forming a sacrificial layer on the first conductive layer, planarizing the sacrificial layer and the first conductive layer exposing the top surface of the molding pattern, and removing the planarized sacrificial layer. The sacrificial layer may be formed of a material layer having an etch selectivity with respect to the first conductive layer and the molding pattern. The sacrificial layer may comprise an oxide layer.

In further embodiments, the molding pattern may be formed of a material layer having an etch selectivity with respect to the first conductive layer.

In still further embodiments, the method may additionally include forming a second conductive layer on the inter-gate dielectric layer, and patterning the second conductive layer, the inter-gate dielectric layer and conductive pattern forming at least one gate pattern crossing over the active region. The second conductive layer may comprise a polysilicon layer. The semiconductor substrate may have a first region and a second region, the isolation layer may be formed such that the active region is defined in the first and second regions, and the molding pattern may be formed on the isolation layer in the first region. In this case, the method may further include patterning the inter-gate dielectric layer exposing the conductive pattern in the second region prior to formation of the second conductive layer. Moreover, the second conductive layer, the inter-gate dielectric layer and conductive pattern may be patterned forming a gate line crossing over the active region in the first region and a selection line crossing over the active region in the second region, and the gate pattern may comprise the selection line and the gate line. The selection line may be formed including a lower gate having a flat top surface and an upper gate on the lower gate. Alternatively, the second conductive layer, the inter-gate dielectric layer and conductive pattern may be patterned forming a sensing line crossing over the active region in the first region and a word line crossing over the active region in the second region. In this case, the gate pattern may comprise the sensing line and the word line. The word line may be formed including a lower gate having a flat top surface and an upper gate on the lower gate.

In an exemplary embodiment, the nonvolatile memory device includes an isolation layer formed in a semiconductor substrate defining active region. A gate line is disposed crossing over the active region. The gate line includes a floating gate on the active region, a control gate overlying the floating gate, and an inter-gate dielectric layer between the floating gate and the control gate. The floating gate includes a body plate on the active region and a pair of protrusions extending upwardly from both ends of the body plate. A selection line is disposed crossing over the active region and is adjacent to the gate line. The selection line includes a lower gate crossing over the active region and an upper gate stacked on the lower gate.

In some embodiments, the floating gate and the lower gate may be formed of the same material layer, and the control gate and the upper gate may be formed of the same material layer.

In an exemplary embodiment, the nonvolatile memory device includes an isolation layer formed in a semiconductor substrate defining an active region. A sensing line is disposed crossing over the active region. The sensing line includes a floating gate on the active region, a control gate overlying the floating gate, and an inter-gate dielectric layer between the floating gate and the control gate. The floating gate includes a body plate on the active region and a pair of protrusions extending from both ends of the body plate upwardly. A word line is disposed crossing over the active region and is adjacent to the sensing line. The word line includes a lower gate crossing over the active region and an upper gate stacked on the lower gate.

In some embodiments, the floating gate and the lower gate may be formed of the same material layer, and the control gate and the upper gate may be formed of the same material layer.

BRIEF DESCRIPTION OF THE DRAWINGS

FIGS. 3A to 3J are cross sectional views illustrating methods of fabricating nonvolatile memory devices according to exemplary embodiments of the present invention.

DETAILED DESCRIPTION OF EXEMPLARY EMBODIMENTS

Figure 1A:
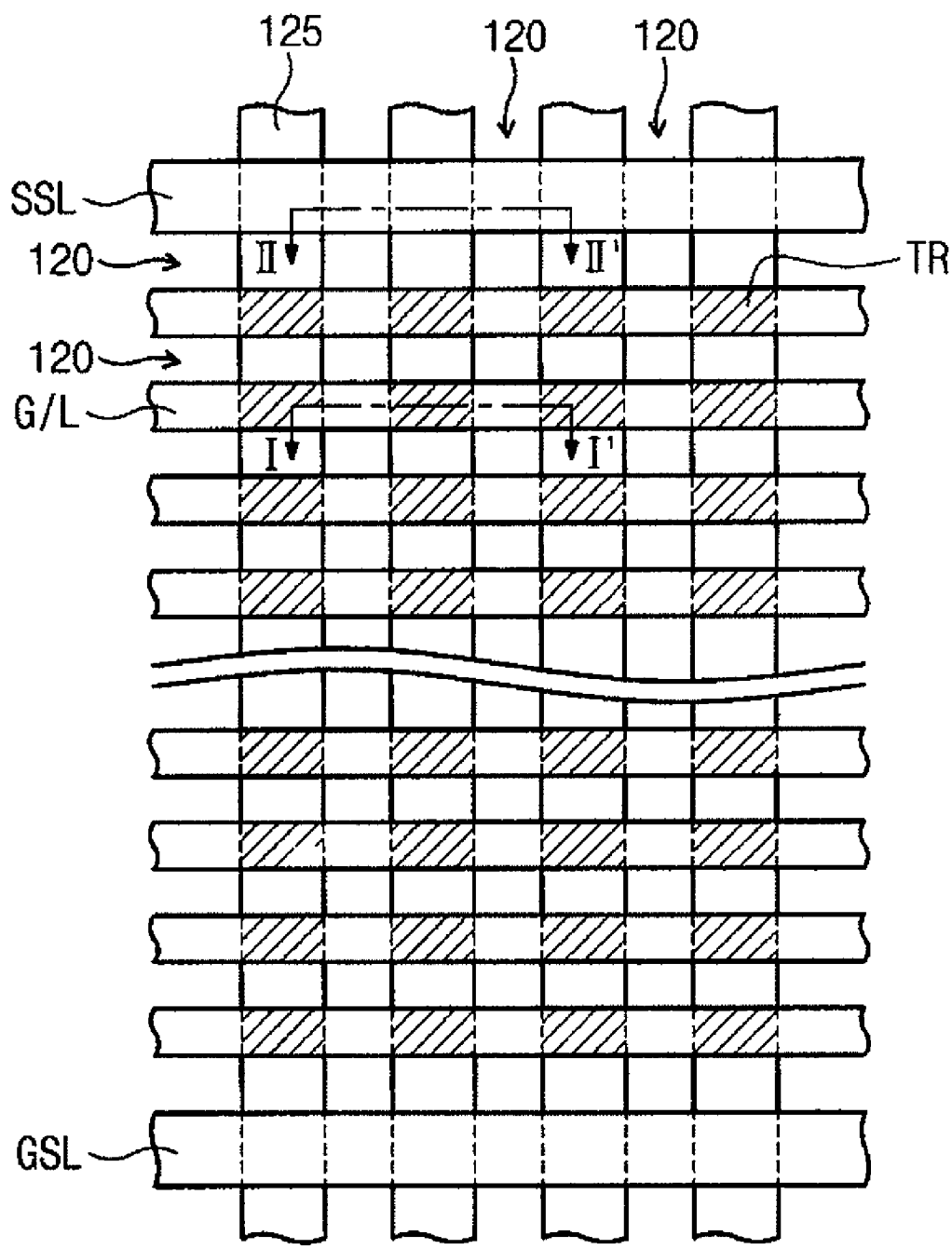
FIGS. 1A and 1B are respectively a plan view and a perspective view illustrating a nonvolatile memory device according to an exemplary embodiment of the present invention.

Exemplary embodiments of the present invention will now be described more fully hereinafter with reference to the accompanying drawings. This invention, however, may be embodied in many different forms and should not be construed as limited to the exemplary embodiments set forth herein. Rather, these embodiments are provided so that this disclosure will be thorough and complete, and will fully convey the scope of the invention to those skilled in the art. In the drawings, the thicknesses of layers and regions may be exaggerated for clarity. It will also be understood that when a layer is referred to as being "on" another layer or substrate, it can be directly on the other layer or substrate, or intervening layers may also be present. Like numbers may refer to like elements throughout.

Figure 1B:
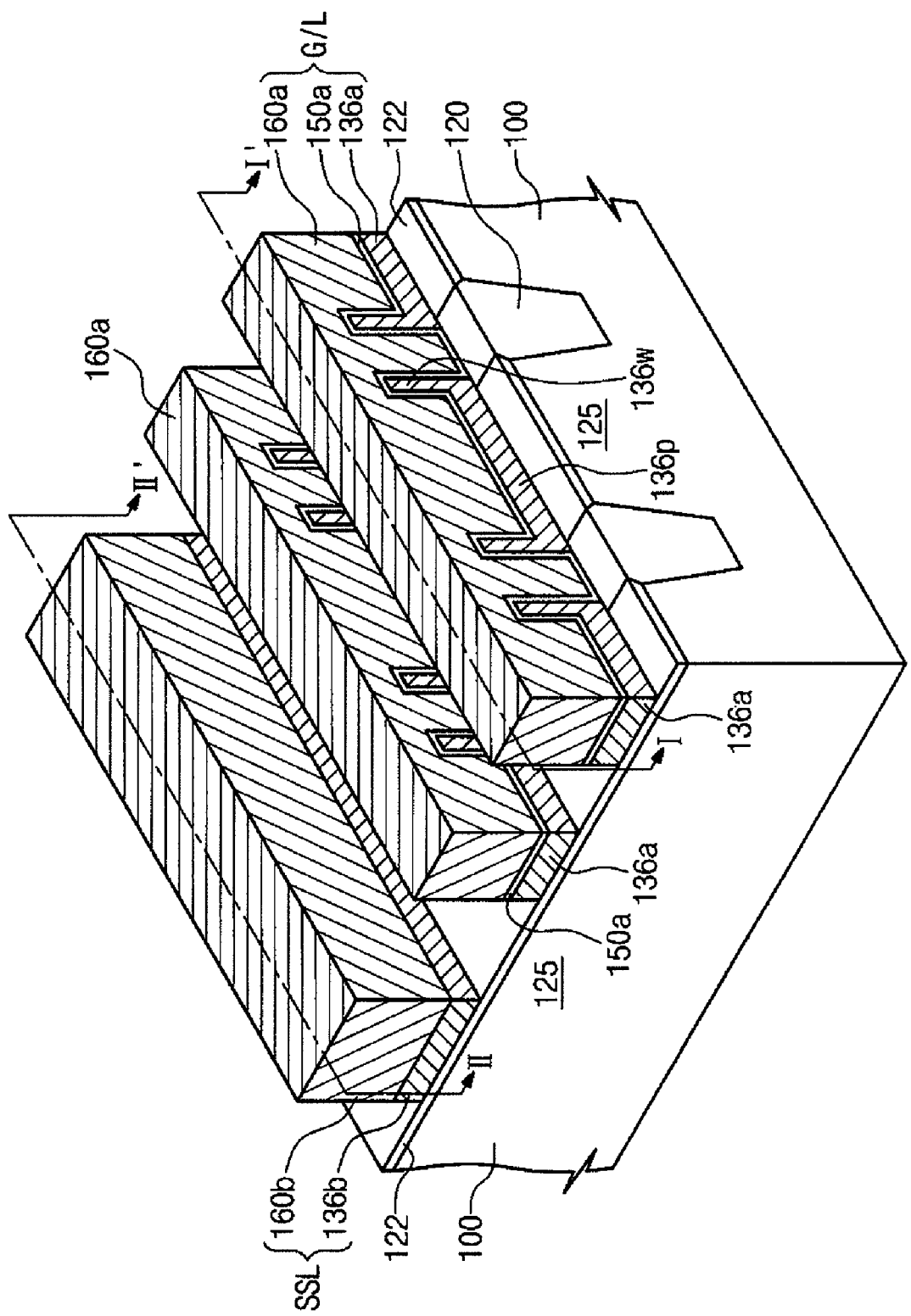

FIGS. 1A and 1B are respectively a plan view and a perspective view illustrating a nonvolatile memory device according to an exemplary embodiment of the present invention. In this embodiment, the nonvolatile memory device may comprise a flash memory device.

Referring to FIGS. 1A and 1B, an isolation layer 120 may be disposed in a semiconductor substrate 100 to define a plurality of active regions 125. The active regions 125 may be parallel to each other. A plurality of gate lines G/L are disposed crossing over the active regions 125 and the isolation layer 120 therebetween. Each of the gate lines G/L may include a control gate 160a crossing over the active regions 125, a plurality of floating gates 136a disposed between the control gate 160a and the active regions 125, and an inter-gate dielectric layer pattern 150a disposed between the floating gate 136a and the control gate 160a. As a result, a plurality of cell transistors may be disposed at intersections between the active regions 125 and the gate lines G/L, respectively. A tunnel insulating layer 122 may be disposed between the floating gates 136a and the active regions 125.

Each of the floating gates 136a may include a plate body 136p disposed across the active region 125 and at least one protrusion 136w which extends from at least one of both ends of the plate body 136p toward a direction perpendicular to the semiconductor substrate 100. For example, each of the floating gates 136a may include the plate body 136p having both ends adjacent to the isolation layer 120 and a pair of protrusions 136w which extend from the both ends of the plate body 136p upwardly, as illustrated in FIG. 1B.

The cell transistors may be serially disposed on the respective active regions constituting a cell string. A string selection line SSL and a ground selection line GSL may be disposed at both ends of the cell string and may extend parallel to the gate lines G/L. The string selection line SSL and the ground selection line GSL may also cross over the active regions 125. The string selection line SSL may comprise a selection floating gate 136b and a selection control gate 160b which are sequentially stacked. The selection floating gate 136b and the floating gates 136a may be formed of the same material layer. Similarly, the selection control gate 160b and the control gates 160a may be formed of the same material layer. The ground selection line GSL may have the same structure as the string selection line SSL. The ground selection line GSL may also include the selection floating gate 136b and the selection control gate 160b which are sequentially stacked. When the nonvolatile memory device according to the present embodiment corresponds to a NAND type flash memory device, each of the string selection line SSL and the ground selection line GSL may have a width which is greater than that of the gate lines G/L.

Figure 2A:
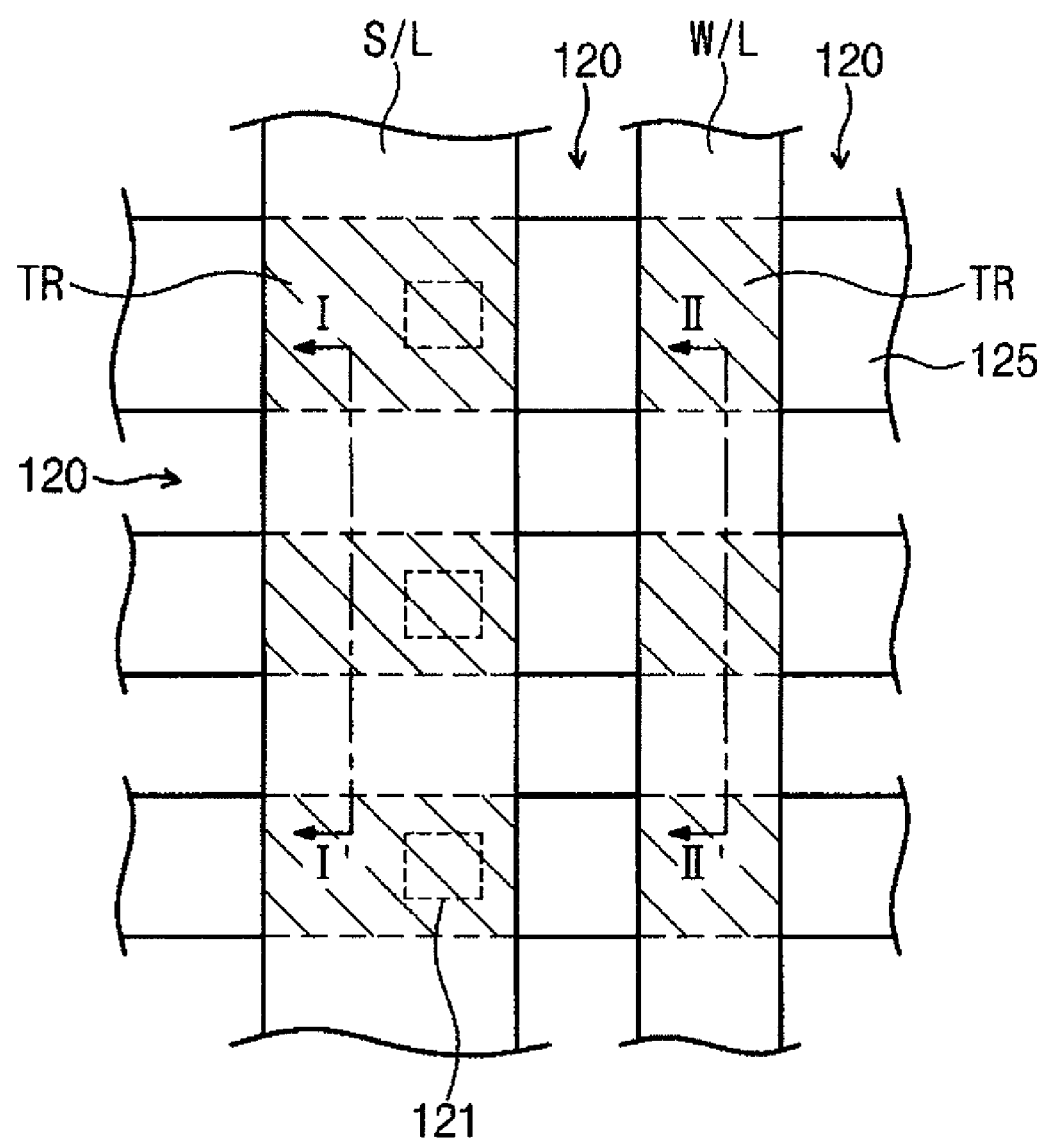
FIGS. 2A and 2B are respectively a plan view and a perspective views illustrating a nonvolatile memory device according to an exemplary embodiment of the present invention.
Figure 2B:
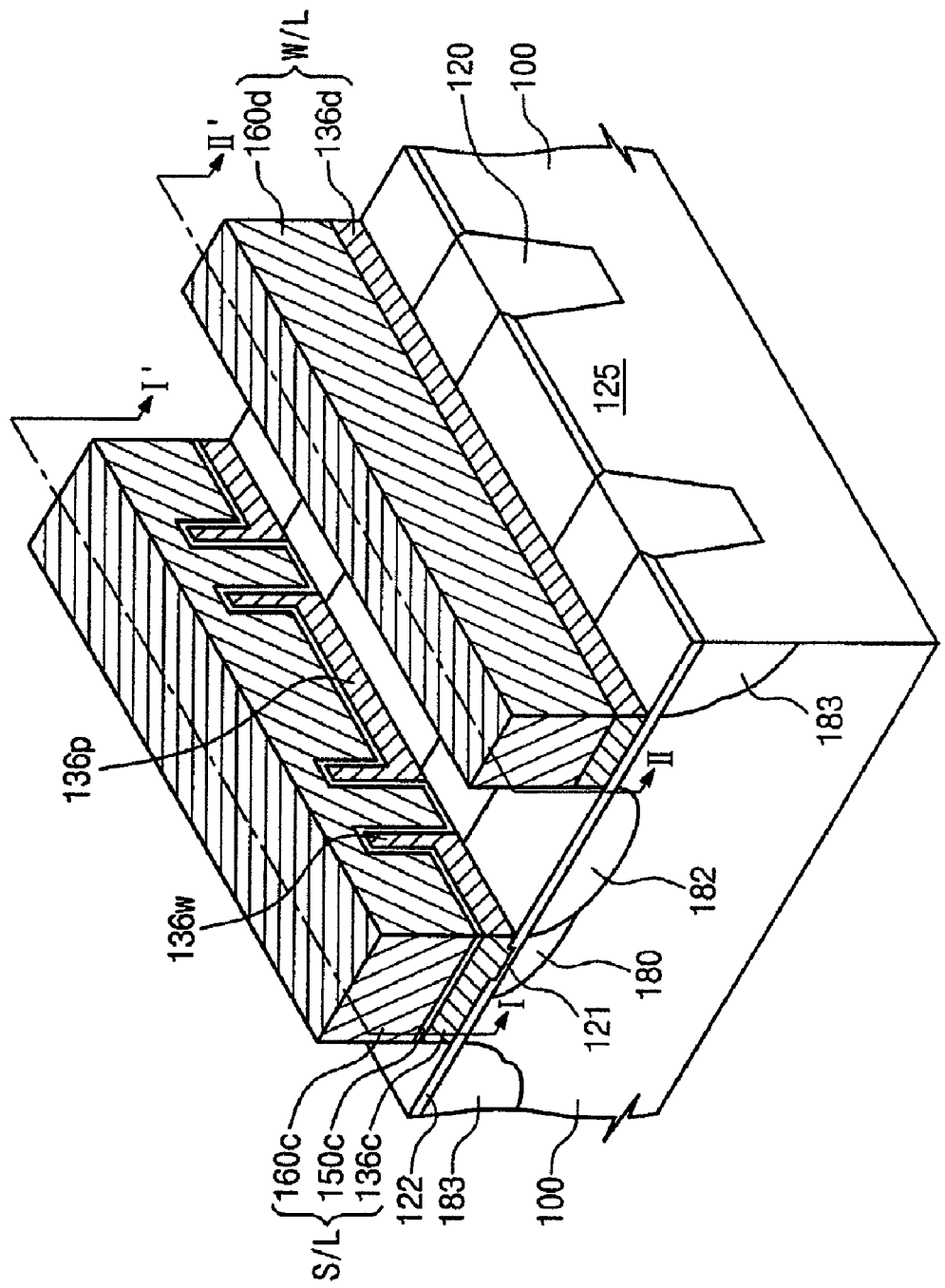

FIGS. 2A and 2B are respectively plan view and perspective view illustrating a nonvolatile memory device according to an exemplary embodiment of the present invention. In this embodiment, the nonvolatile memory device may comprise the EEPROM device.

Referring to FIGS. 2A and 2B, an isolation layer 120 is disposed in a semiconductor substrate 100 defining a plurality of active regions 125. A sensing line S/L and a word line W/L may be disposed crossing over the active regions 125 and the isolation layer therebetween. A plurality of memory transistors may be respectively disposed at intersections between the sensing line S/L and the active regions 125, and a plurality of selection transistors may be respectively disposed at intersections between the word line W/L and the active regions 125. A gate insulating layer 122 may be disposed between the sensing line S/L and the active regions 125. Further, the gate insulating layer 122 may be disposed between the word line W/L and the active regions 125.

Each of the memory transistors may include a tunneling region 121 through which charges are penetrated programming or erasing the memory transistor. Each of the tunneling regions 121 may be disposed on a portion of the active region 125 which overlaps with the sensing line S/L, and the tunneling regions 121 may have a tunneling oxide layer which is thinner than the gate insulating layer 122. Tunneling impurity regions 180 may be disposed in the active regions 125 below the tunneling regions 121, respectively. The tunneling impurity regions 180 may be doped with n-type impurities.

The sensing line S/L may include a plurality of first floating gates (e.g., a plurality of lower gates) 136c, an inter-gate dielectric layer pattern 150c and a first control gate (e.g., an upper gate) 160c. Each of the first floating gates 136c may comprise a plate body 136p disposed across one of the active regions 125 and at least one protrusion 136w which extends from at least one of both ends of the plate body 136p toward a direction perpendicular to the semiconductor substrate 100. For example, each of the floating gates 136c may include the plate body 136p having both ends adjacent to the isolation layer 120 and a pair of protrusions 136w which extend from the both ends of the plate body 136p upwardly, as illustrated in FIG. 2B. The first control gate 160c is disposed crossing over the active regions 125, and the first floating gates 136c are disposed between the first control gate 160c and the active regions 125. Further, the inter-gate dielectric layer pattern 150c is disposed between the first control gate 160c and the first floating gates 136c.

The word line W/L may include a second floating gate (e.g., a lower gate) 136d crossing over the active regions 125 and a second control gate (e.g., an upper gate) 160d stacked on the second floating gate 136d. The first and second floating gates 136c and 136d may be formed of the same material layer. Similarly, the first and second control gates 160c and 160d may be formed of the same material layer. An N-type high voltage impurity regions 182 may be disposed in the active regions 125 between the sensing line S/L and the word line W/L. Further, source/drain regions 183 may be disposed in the active regions 125 which are adjacent to the sensing line S/L and the word line W/L and opposite to the N-type high voltage impurity regions 182. The source/drain regions 183 may also be doped with N-type impurities.

According to the embodiments described above, each of the floating gates 136a or 136c may have at least one protrusion 136w which extends vertically from at least one end thereof. Accordingly, an overlap area between the floating gate 136a or 136c and the control gate 160a or 160c may be increased within a limited planar area, thereby increasing a coupling ratio of the memory transistor or the cell transistor.

FIGS. 3A to 3J are cross sectional views illustrating methods of fabricating nonvolatile memory devices according to exemplary embodiments of the present invention. First regions of FIGS. 3A to 3J show cross sectional views which are taken along the line I-I' of FIGS. 1A, 1B, 2A and 2B. Second regions of FIGS. 3A to 3J show cross sectional views which are taken along the line II-II' of FIGS. 1A, 1B, 2A and 2B.

Figure 3B:
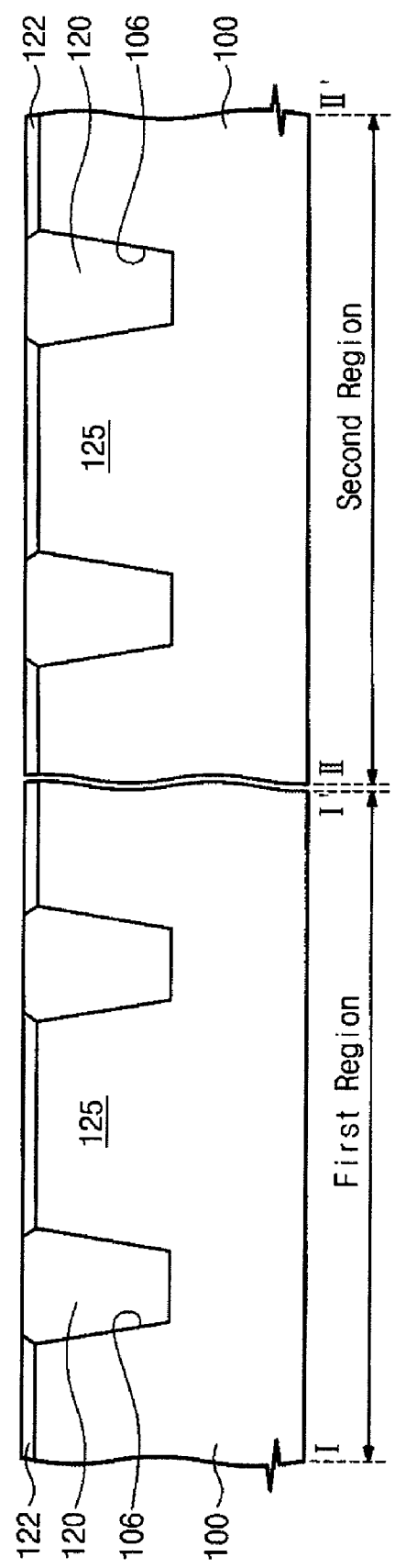

Referring to FIGS. 3A and 3B, an isolation layer 120 is formed in a predetermined region of a semiconductor substrate 100 defining a plurality of active regions 125. The isolation layer 120 may be formed using a conventional isolation technique such as a trench isolation technique. For example, a mask layer is formed on the semiconductor substrate 100, and the mask layer is patterned forming a mask pattern 105 which exposes a portion of the semiconductor substrate 100. The exposed semiconductor substrate 100 is etched using the mask pattern 105 as an etching mask, thereby forming a trench 106 in the semiconductor substrate 100. An inner wall oxide layer (not shown) may then be formed on an inner wall of the trench 106 curing etch damage applied to the semiconductor substrate 100 during formation of the trench 106. In addition, a trench oxide layer (not shown) may be formed on the inner wall of the trench 106 preventing a leakage current of a junction region formed in a subsequent process from flowing into the semiconductor substrate 100. A trench insulating layer 110 is formed in the trench 106 and on the mask pattern 105. The trench insulating layer 110 may be formed of an insulating layer having an excellent gap filling characteristic preventing voids from being formed in the trench 106 during formation of the trench insulating layer 110. The trench insulating layer 110 may be formed of a single oxide layer or a combination layer of at least two oxide layers.

Referring again to FIG. 3B, the trench insulating layer 110 may be planarized using a conventional planarization technique. The planarization process may be performed using the mask pattern 105 as a planarization stopper. The mask pattern 105 may be removed after planarization of the trench insulating layer 110. A top portion of a planarized trench insulating layer 110 may also be etched during removal of the mask pattern 105 or during additional process. As a result, the isolation layer 120 may be formed in the trench 106. Preferably, a surface of the isolation layer 120 may be even with a surface of the substrate 100. A gate insulating layer 122 is then formed on the semiconductor substrate where the mask pattern 105 is removed. The gate insulating layer 122 may be formed using a thermal oxidation technique. In this case, the gate insulating layer 122 may be selectively formed on the active regions 125. Further, the gate insulating layer 122 may be etched forming openings which expose the active regions, and a tunneling oxide layer (121 of FIG. 2B) may be formed on the exposed active regions.

Referring to FIG. 3C, a molding pattern 130 may be formed on the isolation layer 120 in the first region. The molding pattern 130 may be formed of an insulating layer. The molding pattern 130 may be formed of a material layer having an etch selectivity with respect to a polysilicon layer for a conductive layer and an oxide layer for a sacrificial layer which are formed in subsequent processes. For example, the molding pattern 130 may be formed of a nitride layer.

In forming the molding pattern 130, a molding layer (not shown) may be formed on the substrate including the gate insulating layer 122. The molding layer may be formed of a silicon nitride (SiN) layer or a silicon oxynitride (SiON) layer. If a thickness of the molding layer increases, an overlap area between a floating gate and a control gate to be formed in subsequent processes may also increase. However, in the event that the molding layer is too thick, it may be difficult to etch the molding layer to have a fine pattern profile which is adequate for a highly integrated nonvolatile memory device. Hence, the thickness of the molding layer may be appropriately determined according to an integration density of the nonvolatile memory device. A photoresist layer (not shown) may be formed on the molding layer, and the photoresist layer may be patterned using a conventional photolithography technique. The photoresist pattern may be formed over the isolation layer 120 in the first region. The molding layer may be then etched using the photoresist pattern as an etch mask. As a result, the molding pattern 130 may be formed on the isolation layer 120 in the first region.

The molding pattern 130 may be formed having a width which is equal to or less than an upper width of the isolation layer 120. If the width of the molding pattern 130 increases to overlap with the active region 125, a width of a floating gate to be formed in a subsequent process may become reduced lowering a cell coupling ratio of the nonvolatile memory device. Thus, it is preferable that the width of the molding pattern 130 may be less than the upper width of the isolation layer 120.

In an exemplary embodiment, the gate insulating layer 122 and the tunneling oxide layer may be formed after formation of the molding pattern 130. In this case, the gate insulating layer 122 may be prevented from being damaged due to an etch process forming the molding pattern 130.

Figure 3D:
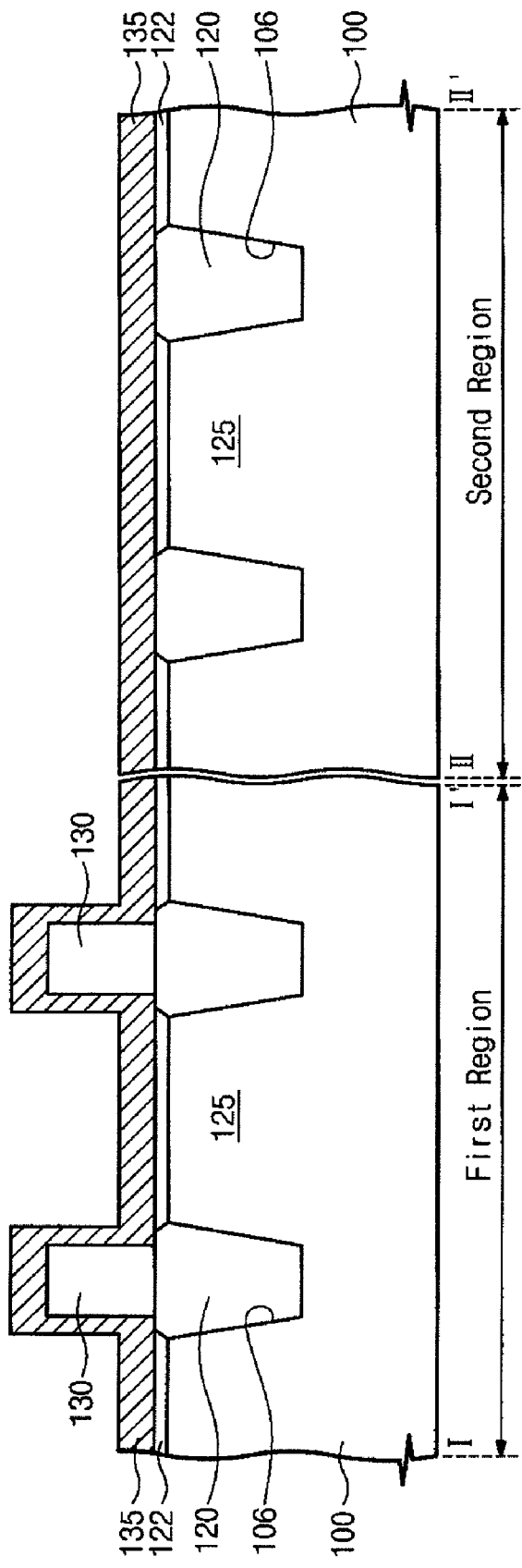

Referring to FIG. 3D, a first conductive layer 135 is formed on the substrate including the gate insulating layer 122 and the molding pattern 130. The first conductive layer 135 may be formed of a doped polysilicon layer. In the event that the first conductive layer 135 is formed of a doped polysilicon layer, the first conductive layer 135 on a side wall of the molding pattern 130 may be thinner than that on the active regions 125.

The first conductive layer 135 may be formed having a thickness which is less than that of a conventional floating gate. For example, when the conventional floating gate has a thickness of about 1500 Å, the first conductive layer 135 may be formed having a thickness of about 1000 Å. If the thickness of the first conductive layer 135 is reduced, a surface area of a floating gate to be formed of the first conductive layer 135 in a subsequent process may be increased. This may lead to an increase in surface area of an inter-gate dielectric layer which may be formed covering the floating gate. The first conductive layer 135 in the second region may substantially have a planar profile since the molding pattern 130 is not formed in the second region.

Figure 3E:
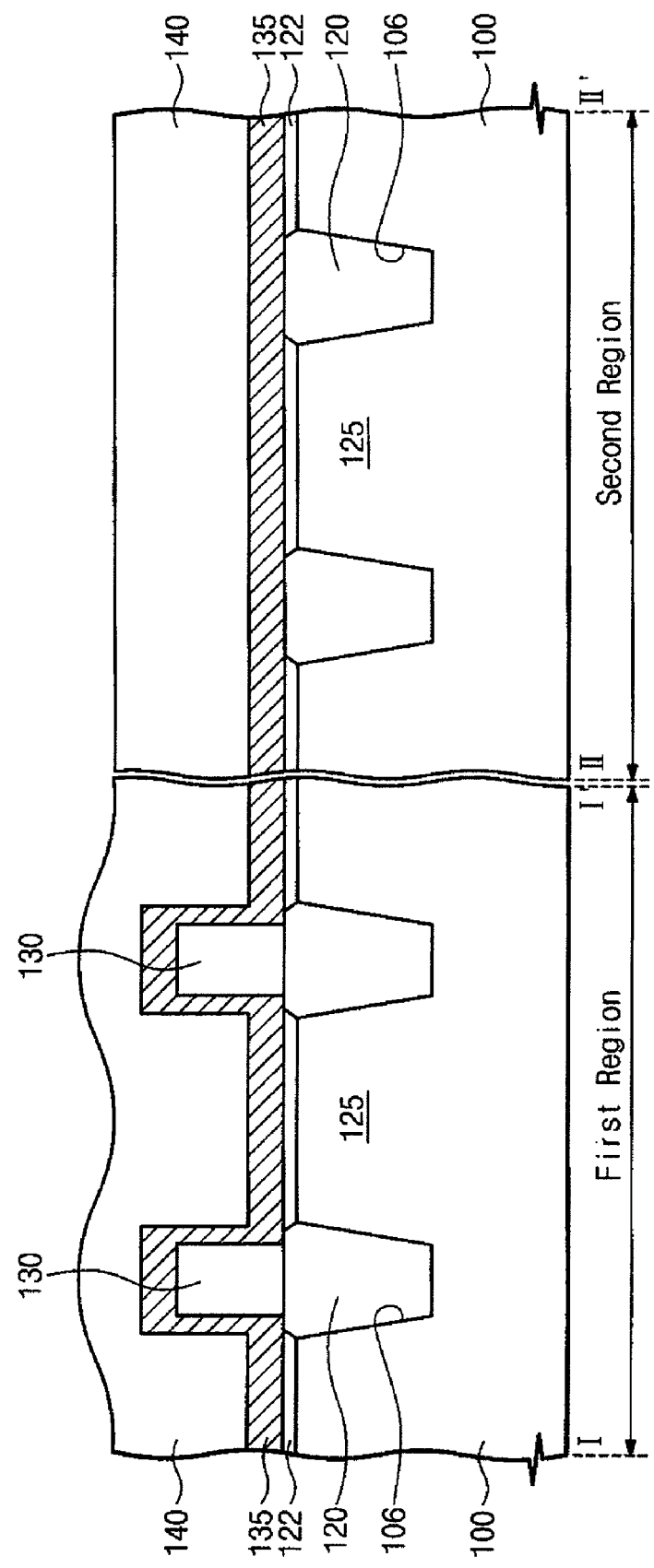

Referring to FIG. 3E, a sacrificial layer 140 may be formed on the first conductive layer 135. The sacrificial layer 140 may be formed of an insulating layer having an etch selectivity with respect to the first conductive layer 135 and the molding pattern 130. For example, the sacrificial layer 140 may be formed of an oxide layer such as a silicon oxide layer. The sacrificial layer 140 may be formed of a material layer having an excellent gap filling characteristic.

Figure 3F:
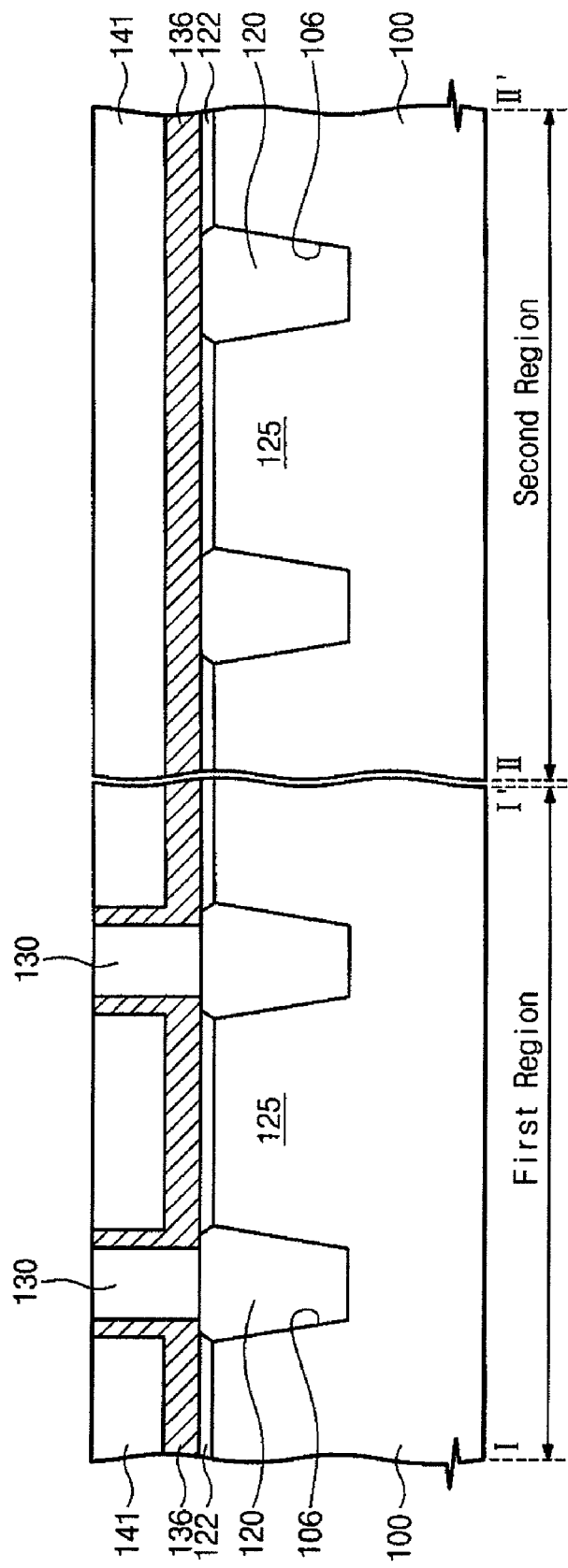

Referring to FIG. 3F, the sacrificial layer 140 and the first conductive layer 135 may be planarized exposing a top surface of the molding pattern 130, thereby forming a plurality of conductive patterns 136 in the first and second regions. Each of the conductive patterns 136 in the first region may cover the gate insulating layer 122 on a single active region 125 and extend onto sidewalls of the molding pattern 130 adjacent to the single active regions 125. The respective conductive patterns 136 in the first region may be formed having a U-shaped sectional view, as illustrated in FIG. 3F. Meanwhile, the conductive pattern 136 in the second region may be a planar pattern, as shown in FIG. 3F. In addition, a plurality of sacrificial material residues 141 may be left in the first and second regions after planarization of the sacrificial layer 140 and the first conductive layer 135. The sacrificial material residues 141 in the first region may be respectively surrounded by the first conductive patterns 136, and the sacrificial material residue 141 in the second region may have a planar shape. The planarization process may be performed using a conventional chemical mechanical polishing (CMP) technique or a conventional etching back technique.

Figure 3G:
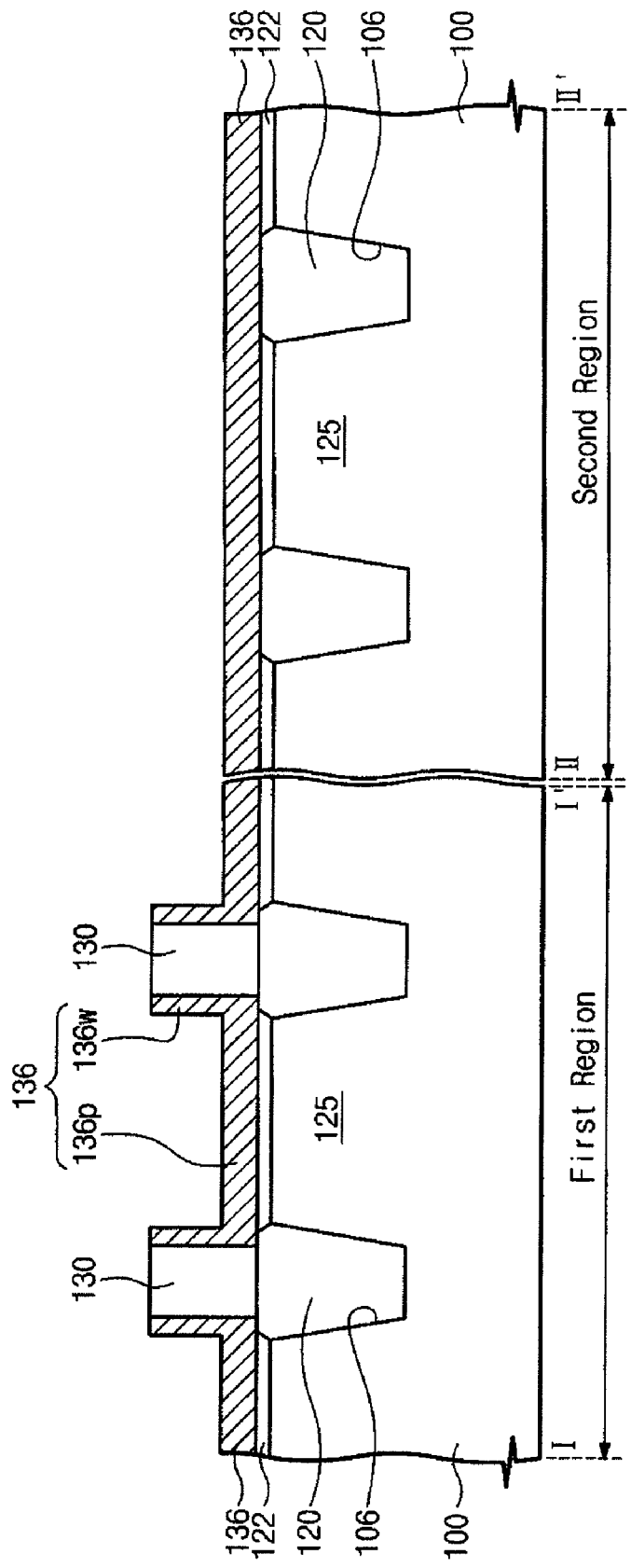

Referring to FIG. 3G, the sacrificial material residues 141 are removed exposing surfaces of the conductive patterns 136. Each of the conductive patterns 136 may include a body plate 136$p$ covering one of the active regions 125 and a pair of protrusions 136$w$ which extend from both ends of the body plate 136$p$ onto the sidewalls of the molding pattern 130, as described above with reference to FIG. 3F. A vertical thickness of the body plate 136$p$ may be greater than a lateral thickness of the protrusions 136$w$.

The sacrificial material residues 141 may have an etch selectivity with respect to the molding pattern 130 and the conductive patterns 136, as described above. Thus, the sacrificial material residues 141 may be completely removed without any recesses of the conductive patterns 136 and the molding pattern 130. In particular, when the sacrificial material residues 141 may have a first etch selectivity with respect the molding pattern 130 and a second etch selectivity with respect to the conductive patterns 136, the second etch selectivity may be higher than the first etch selectivity. This is because the conductive patterns 136 may remain without etch damage and/or recesses even though the molding pattern 130 is etched during removal of the sacrificial material residues 141.

Figure 3H:
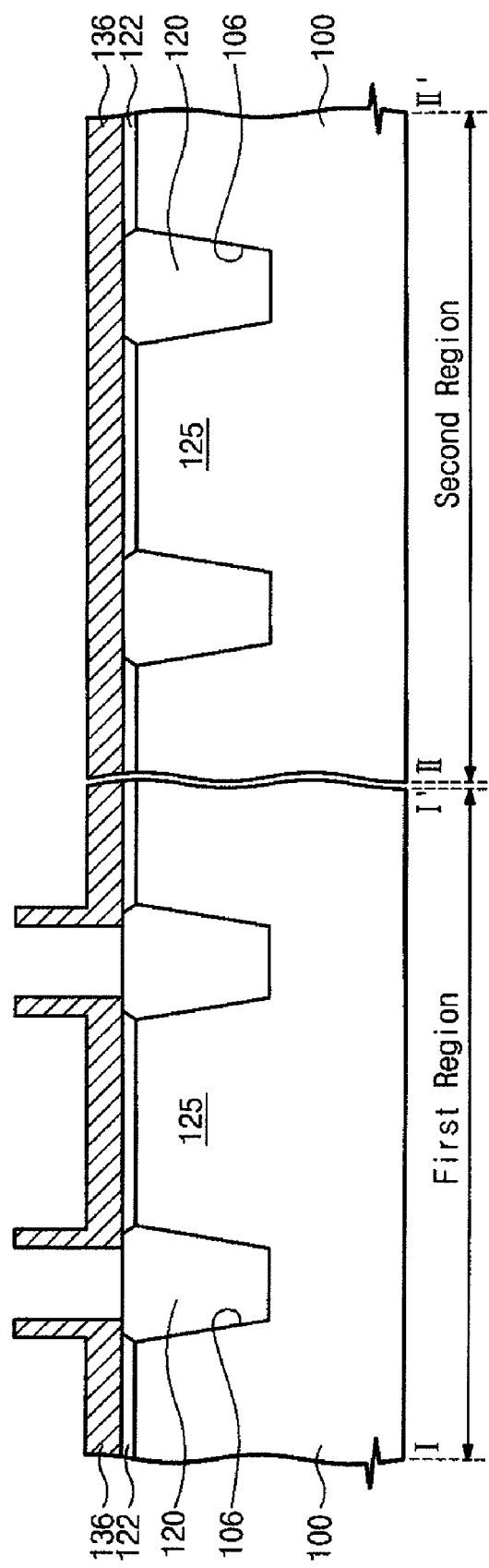

Referring to FIG. 3H, the molding pattern 130 may be removed exposing outer walls of the conductive patterns 136 in the first region. The molding pattern 130 may have an etch selectivity with respect to the conductive patterns 136, the isolation layer 120 and the gate insulating layer 122. Thus, the conductive patterns 136, the isolation layer 120 and the gate insulating layer 122 may be protected from damaged during removal of the molding pattern 130.

Figure 3I:
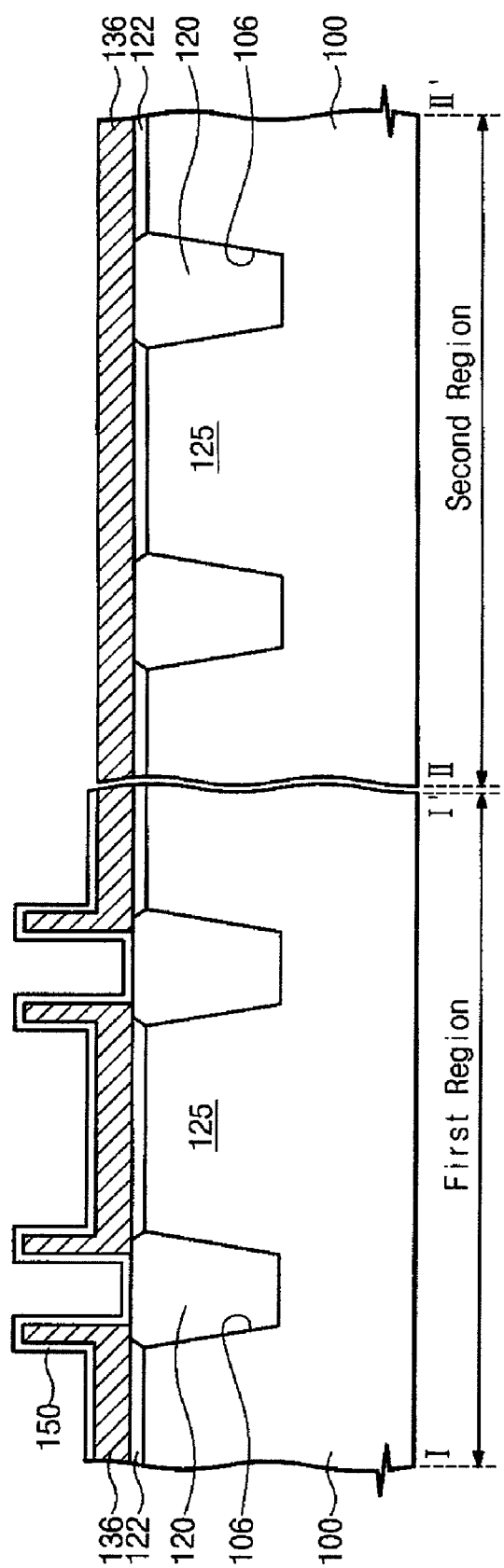

Referring to FIG. 3I, an inter-gate dielectric layer 150 may be formed on the conductive patterns 136 and the isolation layer 120. The inter-gate dielectric layer 150 may be formed of an oxide-nitride-oxide (ONO) layer. The inter-gate dielectric layer 150 may be conformably formed along the surfaces of the conductive patterns 136 and the isolation layer 120. The inter-gate dielectric layer 150 may be formed using a chemical vapor deposition (CVD) technique or an atomic layer deposition (ALD) technique. When a top surface of the isolation layer 120 is coplanar with a top surface of the active regions 125, an overlap area between the inter-gate dielectric layer 150 and the conductive patterns 136 may be maximized. The inter-gate dielectric layer 150 in the second region may be selectively removed exposing the conductive pattern 136 in the second region. The exposed conductive pattern 136 in the second region may have a flat top surface as shown in FIG. 3I.

Figure 3J:
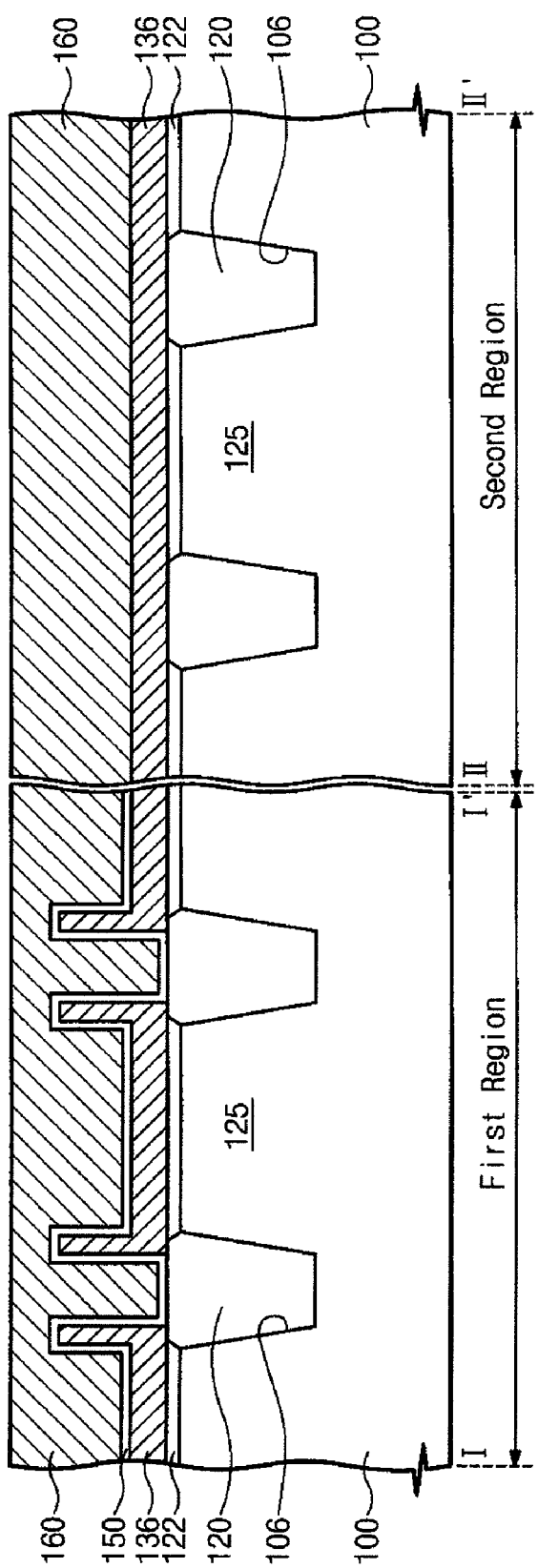

Referring to FIG. 3J, a second conductive layer 160 may be formed on the inter-gate dielectric layer 150 in the first region and the exposed conductive pattern 136 in the second region. The second conductive layer 160 may comprise a doped polysilicon layer. When the second conductive layer 160 is formed of a doped polysilicon layer, the second conductive layer in the first region may be formed having an uneven surface due to the presence of the conductive patterns 136. Thus, the second conductive layer 160 may be planarized using a planarization technique such as a chemical mechanical polishing (CMP) technique or an etching back technique.

The second conductive layer 160, the inter-gate insulating layer 150 and the conductive patterns 136 may be patterned forming gate patterns. The gate patterns may comprise a plurality of gate lines (G/L of FIGS. 1A and 1B) disposed in the first region and selection lines (a string selection line SSL and a ground selection line GSL of FIGS. 1A and 1B) crossing over the active regions 125 in the second region. Alternatively, the gate patterns may comprise a sensing line (S/L of FIGS. 2A and 2B) crossing over the active regions 125 in the first region and a word line (W/L of FIGS. 2A and 2B) disposed in the second region. Spacers may then be formed on sidewalls of the gate patterns.

According to the embodiments described above, a floating gate may comprise a body plate which crosses over an active region and protrusions which upwardly extends from both ends of the body plate. Thus, it can maximize a surface area of the floating gate within a limited planar area. As a result, a cell coupling ratio may be increased without any degradation of integrated density, thereby improving program efficiency and erasure efficiency.

Although the present invention has been described in connection with the exemplary embodiment of the present invention illustrated in the accompanying drawings, it is not limited thereto. It will be apparent to those skilled in the art that various substitutions, modifications and changes may be made without departing from the scope and spirit of the invention.

What is claimed is:

1. A method of manufacturing a semiconductor device, comprising:
   forming an isolation layer in a semiconductor substrate defining an active region;
   forming a molding pattern on the isolation layer;
   forming a first conductive layer on a sidewall and a top surface of the molding pattern and the semiconductor substrate;
   selectively removing the first conductive layer on the top surface of the molding pattern forming a conductive pattern, the conductive pattern including a body plate disposed on the active region and a protrusion which extends from an edge of the body plate onto the sidewall of the molding pattern;
   removing the molding pattern; and
   forming an inter-gate dielectric layer on the isolation layer and the conductive pattern,
   wherein forming the conductive pattern comprises:
   forming a sacrificial layer on the first conductive layer;
   planarizing the sacrificial layer and the first conductive layer exposing the top surface of the molding pattern; and
   removing the planarized sacrificial layer.

2. The method as set forth in claim 1, wherein the sacrificial layer is formed of a material layer having an etch selectivity with respect to the first conductive layer and the molding pattern.

3. The method as set forth in claim 2, wherein the sacrificial layer comprises an oxide layer.

4. The method as set forth in claim 1, wherein forming the molding pattern comprises:
   forming a molding layer on the substrate including the isolation layer; and
   patterning the molding layer exposing the active region.

5. The method as set forth in claim 1, wherein the molding pattern is formed having a width which is less than an upper width of the isolation layer and the body plate extends onto an edge of the isolation layer.

6. The method as set forth in claim 1, wherein the first conductive layer comprises a polysilicon layer.

7. The method as set forth in claim 1, wherein a vertical thickness of the body plate is greater than a lateral thickness of the protrusion.

8. The method as set forth in claim 1, wherein the molding pattern is formed of a material layer having an etch selectivity with respect to the first conductive layer.

9. The method as set forth in claim 1, further comprising:
   forming a second conductive layer on the inter-gate dielectric layer; and
   patterning the second conductive layer, the inter-gate dielectric layer and conductive pattern forming at least one gate pattern crossing over the active region.

10. The method as set forth in claim 9, wherein the second conductive layer comprises a polysilicon layer.

11. A method of manufacturing a semiconductor device, comprising:
    forming an isolation layer in a semiconductor substrate defining an active region;
    forming a molding pattern on the isolation layer;
    forming a first conductive layer on a sidewall and a top surface of the molding pattern and the semiconductor substrate;
    selectively removing the first conductive layer on the top surface of the molding pattern forming a conductive pattern, the conductive pattern including a body plate disposed on the active region and a protrusion which extends from an edge of the body plate onto the sidewall of the molding pattern;
    removing the molding pattern; and
    forming an inter-gate dielectric layer on the isolation layer and the conductive pattern;
    forming a second conductive layer on the inter-gate dielectric layer; and
    patterning the second conductive layer, the inter-gate dielectric layer and conductive pattern forming at least one gate pattern crossing over the active region,
    wherein the semiconductor substrate has a first region and a second region, the isolation layer is formed such that the active region is defined in the first and second regions, and the molding pattern is formed on the isolation layer in the first region, the method further comprising patterning the inter-gate dielectric layer exposing the conductive pattern in the second region prior to formation of the second conductive layer.

12. The method as set forth in claim 11, wherein the second conductive layer, the inter-gate dielectric layer and the conductive pattern are patterned forming a gate line crossing over the active region in the first region and a selection line crossing over the active region in the second region, and wherein the gate pattern comprises the gate line.

13. The method as set forth in claim 12, wherein the selection line is formed including a lower gate having a flat top surface and an upper gate on the lower gate.

14. The method as set forth in claim 11, wherein the second conductive layer, the inter-gate dielectric layer and conductive pattern are patterned forming a sensing line crossing over the active region in the first region and a word line crossing over the active region in the second region, and wherein the gate pattern comprises the sensing line.

15. The method as set forth in claim 14, wherein the word line is formed including a lower gate having a flat top surface and an upper gate on the lower gate.

* * * * *